(12) United States Patent
Takaishi

(10) Patent No.: US 8,735,970 B2
(45) Date of Patent: May 27, 2014

(54) SEMICONDUCTOR DEVICE HAVING VERTICAL SURROUNDING GATE TRANSISTOR STRUCTURE, METHOD FOR MANUFACTURING THE SAME, AND DATA PROCESSING SYSTEM

(76) Inventor: Yoshihiro Takaishi, Tokyo (JP)

( * ) Notice: Subject to any disclaimer, the term of this patent is extended or adjusted under 35 U.S.C. 154(b) by 975 days.

(21) Appl. No.: 12/236,012

(22) Filed: Sep. 23, 2008

(65) Prior Publication Data

US 2009/0085102 A1 Apr. 2, 2009

(30) Foreign Application Priority Data

Sep. 27, 2007 (JP) ................................ 2007-251348

(51) Int. Cl.
*H01L 29/423* (2006.01)

(52) U.S. Cl.
USPC .................................. 257/329; 257/E29.136

(58) Field of Classification Search
USPC .................................................. 257/E29.131
See application file for complete search history.

(56) References Cited

U.S. PATENT DOCUMENTS

| | | | | |
|---|---|---|---|---|
| 4,967,247 A | * | 10/1990 | Kaga et al. | 257/311 |
| 5,258,635 A | * | 11/1993 | Nitayama et al. | 257/329 |
| 6,337,497 B1 | * | 1/2002 | Hanafi et al. | 257/306 |
| 6,373,099 B1 | * | 4/2002 | Kikuchi et al. | 257/331 |
| 6,734,058 B2 | * | 5/2004 | Park | 438/242 |
| 7,585,731 B2 | * | 9/2009 | Shukuri | 438/267 |
| 8,378,417 B2 | * | 2/2013 | Ogawa et al. | 257/329 |
| 8,415,741 B2 | * | 4/2013 | Takaishi | 257/331 |
| 2002/0006699 A1 | * | 1/2002 | Noble et al. | 438/243 |
| 2002/0175365 A1 | * | 11/2002 | Hirayama | 257/329 |
| 2006/0046407 A1 | * | 3/2006 | Juengling | 438/301 |
| 2007/0012996 A1 | * | 1/2007 | Yoon et al. | 257/329 |

FOREIGN PATENT DOCUMENTS

| | | |
|---|---|---|
| JP | 02-156664 A | 6/1990 |
| JP | 03-112165 A | 5/1991 |
| JP | 03-218679 A | 9/1991 |
| JP | 05-136374 | 6/1993 |
| JP | 05-160408 A | 6/1993 |
| JP | 09-008295 A | 1/1997 |
| JP | 2005-136376 A | 5/2005 |

* cited by examiner

*Primary Examiner* — Benjamin Sandvik
(74) *Attorney, Agent, or Firm* — Sughrue Mion, PLLC

(57) ABSTRACT

A semiconductor device is provided which includes: semiconductor pillars which include impurity diffused layers, each semiconductor pillar having a width which allows full depletion of a semiconductor forming each semiconductor pillar, the impurity diffused layers being electrically connected to each other; and a common gate section which covers side faces of the pillars.

20 Claims, 12 Drawing Sheets

SEMICONDUCTOR DEVICE HAVING VERTICAL SURROUNDING GATE TRANSISTOR STRUCTURE, METHOD FOR MANUFACTURING THE SAME, AND DATA PROCESSING SYSTEM

BACKGROUND OF THE INVENTION

1. Field of the Invention

The present invention relates to semiconductor devices having a vertical surrounding gate transistor (SGT) structure, methods for manufacturing the semiconductor devices, and data processing systems which include the semiconductor devices.

Priority is claimed on Japanese Patent Application No. 2007-251348, filed Sep. 27, 2007, the content of which is incorporated herein by reference.

2. Description of Related Art

Highly integrated and high performance semiconductor devices have been realized, for the most part, by the refinement of transistors. However, in recent years, it is becoming difficult to simply refine transistors. In the future, it will be difficult to realize highly integrated and high performance semiconductor devices by only the refinement of planar metal oxide semiconductor (MOS) transistors which has been performed so far. Therefore, transistors having a three-dimensional structure have been investigated as a measure of refining transistors.

For example, a three-dimensional transistor having a vertical SGT structure disclosed in Japanese Unexamined Patent Application, First Publication No. H05-136374 (hereinafter referred to as "Patent Document 1") employs a silicon pillar extending along the direction orthogonal to the principal plane of a semiconductor substrate as a channel of a transistor. As shown in FIG. 1 of Patent Document 1, a semiconductor substrate 1 has a semiconductor pillar (the silicon pillar) which functions as the channel. A gate electrode 2 is provided around the pillar with a gate insulating film 5 interposed therebetween. A drain region 3 is provided on a side of a lower part of the pillar. A source region 4 is provided at an upper portion of the pillar. A source electrode 6 is connected to the source region 4 with an insulating film 70 interposed therebetween to form a metal insulation semiconductor (MIS) capacitor. There are also provided: a channel stopper 10 and a field insulating film 11 for device separation; and an insulating film 8 which insulates the source region 4 and the drain region 3 from the source electrode 6 and a drain electrode 9.

The present inventor has recognized the following matters.

When the gate length of a transistor is extremely small, the influence of the short channel effect increases and it becomes difficult to control the threshold voltage of the transistor. In addition, the S value increases, and a higher threshold voltage is required from the viewpoint of a reduction in current during the transistor is turned off. An increase in threshold voltage due to an increase in the S value makes it difficult to realize semiconductor devices which operate at a low voltage. If shallow diffused layers of a source and a drain of a transistor are formed in order to alleviate the short channel effect, current is reduced due to increases in resistance of the source and the drain. Moreover, with respect to cell transistors provided in dynamic random access memories (DRAMs), shallow diffused layers increase a junction leak current, thereby deteriorating the refresh characteristics of the DRAMs.

In accordance with a transistor having a three-dimensional structure, the area occupied by the transistor is small. Moreover, the area occupied by the transistor does not increase even if the channel length (the gate length) is increased. Therefore, it is possible to suppress the short channel effect without increasing the area occupied by the transistor. Furthermore, since it is possible to fully deplete the channel, a satisfactory S value and a large drain current can be obtained. In addition, since a gate electrode is formed so as to cover the entire perimeter of the channel having a pillar shape, it is possible to eliminate external factors other than those of a source and a drain and to effectively control the potential of the channel by means of a voltage applied to the gate electrode.

However, in order to fully deplete the channel of a three-dimensional transistor, it is necessary to reduce (thin) the diameter of a silicon pillar which forms the channel. Although depending on the density of impurities in the channel; a voltage applied to a gate; voltages respectively applied to a source and a drain; and the density of impurities in the source and the drain, as a guideline, the diameter of a silicon pillar which allows full depletion of the channel is double or less the height of the silicon pillar, which determines the distance between the source and the drain. If the diameter of the silicon pillar increases, the channel of the transistor is unable to be fully depleted, the S value is deteriorated drastically, the influences of the source and the drain become significant, and the influence of the short channel effect increases. In other words, the characteristics of the transistor approach those of planar transistors.

The drain current of transistors employing a silicon pillar is proportional to the diameter of the silicon pillar which forms the channel. The drain current can be increased by increasing the diameter of the silicon pillar. However, if the diameter of the silicon pillar is increased, the transistors are unable to be fully depleted, so that the characteristics of the transistors are deteriorated drastically. Thus, the drain current of fully depleted transistors employing a silicon pillar is limited. When a large drain current is required, the threshold voltage is increased instead of increasing the diameter of the silicon pillar so as to prevent the S value from being deteriorated. In addition, since the influence of the short channel effect becomes significant, it is necessary to, for example, change the profile of the diffused layers of the source and the drain. However, this leads to an increase in resistance of the diffused layers of the source and the drain, thereby reducing the drain current further.

SUMMARY

The present invention seeks to solve one or more of the above problems, or to improve upon those problems at least in part.

In one embodiment, there is provided a semiconductor device that includes: semiconductor pillars which include impurity diffused layers, each semiconductor pillar having a width which allows full depletion of a semiconductor forming each semiconductor pillar, the impurity diffused layers being electrically connected to each other; and a common gate section which covers side faces of the pillars.

In accordance with this embodiment, the channel of a single transistor having a common gate section and impurity diffused layers which are electrically connected to each other can be formed by semiconductor pillars. Hence, characteristics equal to those of a structure in which a plurality of unit transistors are arranged in parallel can be obtained.

Therefore, even if each semiconductor pillar is thinned to a width which allows full depletion of the semiconductor forming each semiconductor pillar, it is possible to increase the drain current of the transistor without increasing the threshold voltage so as to prevent the S value from being deteriorated and without changing the profile of diffused-layers of the source and the drain taking the influence of the short channel effect into consideration. Therefore, it becomes possible to avoid influences due to an increase in width of each pillar (e.g., a drastic deterioration in the S value as a result of the semiconductor forming the pillars being not fully depleted, an influence of the short channel effect as a result of the influence of the source and the drain becoming remarkable, etc.) as well as influences by changing the profile of the diffused layers (e.g., a reduction in drain current due to an increase in resistance of the diffused-layers of the source and the drain). Thus, even in semiconductor devices which operate at a low voltage, a satisfactory (small) S value and a large drain current can be obtained while maintaining the characteristics of fully depleted transistors. Therefore, it is possible to realize miniaturized, quickly responsive, and low power consumption semiconductor devices.

In another embodiment, there is provided a data processing system that includes a semiconductor device which is provided with: semiconductor pillars which include impurity diffused layers, each semiconductor pillar having a width which allows full depletion of a semiconductor forming each semiconductor pillar, the impurity diffused layers being electrically connected to each other; and a common gate section which covers side faces of the pillars.

In accordance with this embodiment, since miniaturized, quickly responsive, and low power consumption semiconductor devices can be realized as explained above, it is possible to realize miniaturized, quickly responsive, and low power consumption data processing systems having such semiconductor devices.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
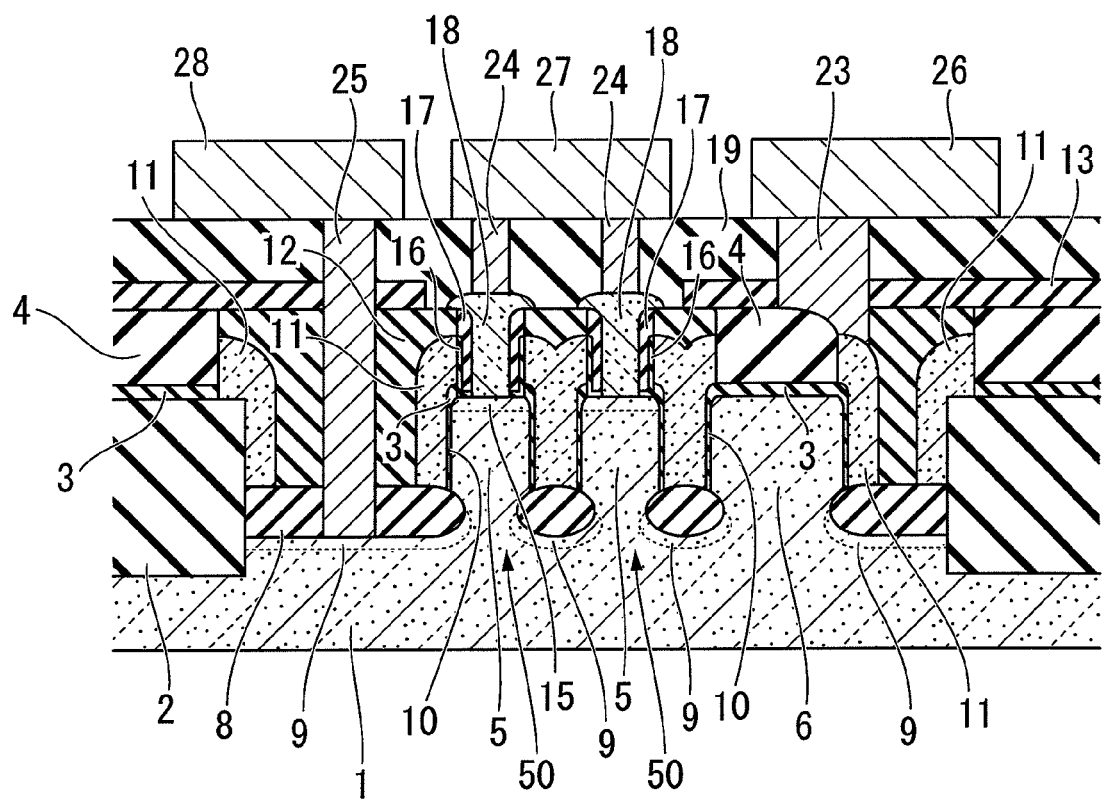
FIG. 1 is a cross-sectional view of a part of a semiconductor device in accordance with a first embodiment of the present invention taken along a line X-X shown in FIG. 2.
Figure 1:
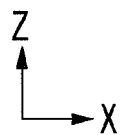

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the drawings mentioned in the following description, structural elements are illustrated so as to facilitate the understanding of the respective structural elements. As a result, scales of the illustrated structural elements and the number thereof may be different from those of actual structural elements. Moreover, the arrangement of the respective structural elements will be explained using an XYZ coordinate system. In this coordinate system, the Z direction is a direction orthogonal to a surface of a silicon substrate, the X direction and the Y direction are directions orthogonal to the Z direction, and the X direction and the Y direction are orthogonal to each other.

Semiconductor Device

FIG. 1 is a schematic view showing the cross section of the structure of a semiconductor device in accordance with a first embodiment of the present invention. A shallow trench isolation (STI) 2, which functions as a trench for separating semiconductor devices, is provided in a silicon substrate 1 (a semiconductor substrate). A plurality of silicon pillars (semiconductor pillars) 5 are provided in a standing manner around the center of an area surrounded by the STI 2. Each silicon pillar 5 is a semiconductor layer having a pillar shape which forms a channel and parts of a source section and a drain section of each unit transistor 50. The silicon pillars 5 have the same height and are arranged in parallel with each other. Each silicon pillar 5 has a width (i.e., the size of the cross-section thereof in a plane parallel to the silicon substrate 1) which allows full depletion of a semiconductor which forms each silicon pillar 5 (i.e., the channel of each unit transistor 50). Although depending on the density of impurities in the channel; a voltage applied to a gate section; voltages respectively applied to the source section and the drain section; and the density of impurities in the source section and the drain section, as a guideline, the diameter of each silicon pillar 5 which allows full depletion of the channel is double or less the height of each silicon pillar 5, which determines the distance between the source section and the drain section.

A pillar lower diffused layer (hereinafter referred to as "lower diffused layer") 9, which is a first impurity diffused layer, is formed at the lower end portions (first end portions) of the silicon pillars 5 and formed around the silicon pillars 5. The lower diffused layer 9 of each silicon pillar 5 extends over an area between the silicon pillars 5, and connects to the lower diffused layer 9 of adjacent silicon pillars 5. That is, the lower diffused layers 9 formed at the lower end portions of the silicon pillars 5 are electrically connected to each other. Pillar upper diffused layers (hereinafter referred to as "upper diffused layers") 15, which are second impurity diffused layers, are formed at the upper end portions (second end portions) of the silicon pillars 5. Silicon plugs 18, which are third impurity diffused layers, are formed on the upper diffused layers 15 Furthermore, the lower diffused layer 9 is also formed at the lower end portion of a gate-lifting silicon pillar 6 described later and formed around the gate-lifting silicon pillar 6. The upper diffused layers 15 and the silicon plugs 18 are source diffused-layers. The lower diffused layer 9 formed at the lower end portions of the silicon pillars 5 and formed around the silicon pillars 5 are drain diffused-layers. An intermediate portion of each silicon pillar 5 which is interposed between each upper diffused layer 15 and the lower diffused layer 9 is the channel of each unit transistor 50. The silicon pillars 5 are closely arranged at an interval double or less the thickness of each gate electrode 11.

A gate-lifting silicon pillar 6, which lifts (i.e., increases the height of) the gate electrodes 11, is formed near a silicon pillar group which consists of the silicon pillars 5. The silicon pillars 5 and the gate-lifting silicon pillar 6 are formed by etching a surface of the silicon substrate 1. The gate-lifting silicon pillar 6 is a semiconductor layer having a pillar shape which protrudes from the etched surface of the silicon substrate 1. In conjunction with a mask nitride film 4 which will be described later, the gate-lifting silicon pillar 6 (a first protruding layer) functions as a protruding layer which increases the height of the gate electrodes 11 and shortens the distance between the gate electrodes 11 and a metal wire (a gate wire) 26 provided above the gate electrodes 11. The interval between the gate-lifting silicon pillar 6 and the silicon pillars 5 which are closest to the gate-lifting silicon pillar 6 (i.e., the size of gaps between these silicon pillars 5 and the gate-lifting silicon pillar 6) is double or less the thickness of each gate electrode 11.

An oxide film (a first insulating film) 8 is formed on the etched surface of the silicon substrate 1 which is exposed around the silicon pillars 5 and the gate-lifting silicon pillar 6. The oxide film 8 covers the peripheries of the lower portions of the silicon pillars 5 and the periphery of the lower portion of the gate-lifting silicon pillar 6, and reaches the STI 2. The lower diffused layer 9 is provided at the lower end portions of the silicon pillars 5 and the gate-lifting silicon pillar 6 and provided under the oxide film 8 so as to overlap the oxide film 8. Thus, the oxide film 8 is formed between the gate electrodes 11 and the lower diffused layer 9, so that the lower diffused layer 9 is electrically insulated from the gate electrodes 11 by means of the oxide film 8. The silicon pillars 5 and the gate-lifting silicon pillar 6 are electrically connected to each other by the lower diffused layer 9. The lower diffused layer 9 formed in the silicon pillars 5 and formed around the silicon pillars 5 function as a common drain section of the unit transistors 50. It is noted that the STI 2 is formed deeper than the lower diffused layer 9 so that lower diffused layers 9 respectively provided in areas which are adjacent across the STI 2 do not conduct each other.

Gate insulating films 10 are formed on side faces of the silicon pillars 5 and the gate-lifting silicon pillar 6. The gate electrodes 11 are formed over the surfaces of the silicon pillars 5 and the gate-lifting silicon pillar 6 with the gate insulating films 10 interposed therebetween. The gate electrodes 11 are also formed on a part of the inner wall of the STI 2, the inner wall of an oxide film 3 which is stacked on the top face of the STI 2, and a part of the inner wall of the mask nitride film 4 which is stacked on the top face of this oxide film 3. The gate insulating films 10 cover the outer periphery surfaces of the silicon pillars 5 and the gate-lifting silicon pillar 6, and are connected to the oxide film 8. The channels of the silicon pillars 5, the upper diffused layers 15, and the lower diffused layer 9 are electrically insulated from the gate electrodes 11 by means of the gate insulating films 10 and the oxide film 8.

The gate electrodes 11 fill gaps between adjacent silicon pillars 5 and gaps between the gate-lifting silicon pillar 6 and the silicon pillars 5 adjacent to the gate-lifting silicon pillar 6. The gate electrodes 11 are formed so as to cover the gate insulating films 10 provided on the side faces of the silicon pillars 5 and the gate-lifting silicon pillar 6. The interval between these silicon pillars 5 and the gate-lifting silicon pillar 6 (i.e., the size of the gaps) are double or less the thickness of each gate electrode 11. The gate electrodes 11 formed over the side faces of adjacent silicon pillars 5 contact each other in the areas between the adjacent silicon pillars 5, and the gate electrodes 11 function as a single gate electrode. The gate electrodes 11 are tightly formed in the gaps between the adjacent silicon pillars 5 over the side faces of the silicon pillars 5, thereby forming a common gate section of the unit transistors 50. Similarly, the interval between the gate-lifting silicon pillar 6 and the silicon pillars 5 closest to the gate-lifting silicon pillar 6 is made double or less the thickness of each gate electrode 11. The gate electrodes 11 are tightly formed in the gaps between these silicon pillars 5 and the gate-lifting silicon pillar 6 over the side faces of these silicon pillars 5 and the gate-lifting silicon pillar 6.

Oxide films 3 are formed on top faces of the STI 2, the silicon pillars 5, and the gate-lifting silicon pillar 6. Mask nitride films 4 are formed over the top faces of the STI 2 and the gate-lifting silicon pillar 6 so as to cover the oxide films 3. A first interlayer insulating film 12 is formed so as to cover the gate electrodes 11 and the oxide film 8. The first interlayer insulating film 12 is formed in an area surrounded by the inner wall surfaces of the STI 2, the oxide film 3 stacked thereon, and the mask nitride film 4 stacked thereon. A mask oxide film 13 is formed on surfaces of the mask nitride films 4 and the first interlayer insulating film 12. An opening is formed in the mask oxide film 13 at a position where the opening overlaps the silicon pillars 5. A second interlayer insulating film 19 is formed on surfaces of the mask oxide film 13 and the first interlayer insulating film 12. Metal wires 26, 27, and 28 are formed on the second interlayer insulating film 19.

The metal wire 26 is connected to the gate electrodes 11 through a metal contact plug (a first conductive plug) 23, which penetrates the second interlayer insulating film 19, the mask oxide film 13, and the first interlayer insulating film 12. The metal contact plug 23 is formed in the area where the metal contact plug 23 overlaps the gate-lifting silicon pillar 6. One of the mask nitride films 4 is formed over the gate-lifting silicon pillar 6 (i.e., on the oxide film 3 formed on the top face of the gate-lifting silicon pillar 6), and the metal contact plug 23 is connected to the upper end of the gate electrode 11 which is formed on the side face of the mask nitride film 4. In conjunction with the gate-lifting silicon pillar 6, the mask nitride film 4 (a second protruding layer) provided over the gate-lifting silicon pillar 6 functions as a protruding layer which increases the height of the gate electrodes 11 and shortens the distance between the gate electrodes 11 and the metal wire 26 provided above the gate electrode 11.

The metal wire (a source wire) 27 is connected to the upper diffused layers 15 through the silicon plugs 18, which penetrate the first interlayer insulating film 12, the gate electrodes 11, and the oxide film 3, and through metal contact plugs (a second conductive plug) 24, which penetrate the second interlayer insulating film 19 and connect to the silicon plugs 18. The silicon plugs 18 are formed by injecting (diffusing) impurities such as arsenic into silicon. In conjunction with the upper diffused layers 15, the silicon plugs 18 form source sections of the unit transistors 50. Oxide films (second insulating films) 16 and sidewall nitride films (second insulating films) 17 are formed on the side faces of the silicon plugs 18. Hence, the silicon plugs 18 are electrically insulated from the gate electrodes 11 by means of the sidewall nitride films 17 and the oxide films 16. One metal contact plug 24 and one silicon plug 18 are provided for each silicon pillar 5.

The metal wire (a drain wire) 28 is connected to the lower diffused layer 9 through a metal contact plug 25 (a third conductive plug), which penetrates the second interlayer insulating film 19, the mask oxide film 13, the first interlayer insulating film 12, and the oxide film 8. The metal contact plug 25 is formed at an intermediate area between the silicon pillars 5 and the STI 2 where no gate electrodes 11 are formed.

Figure 2:
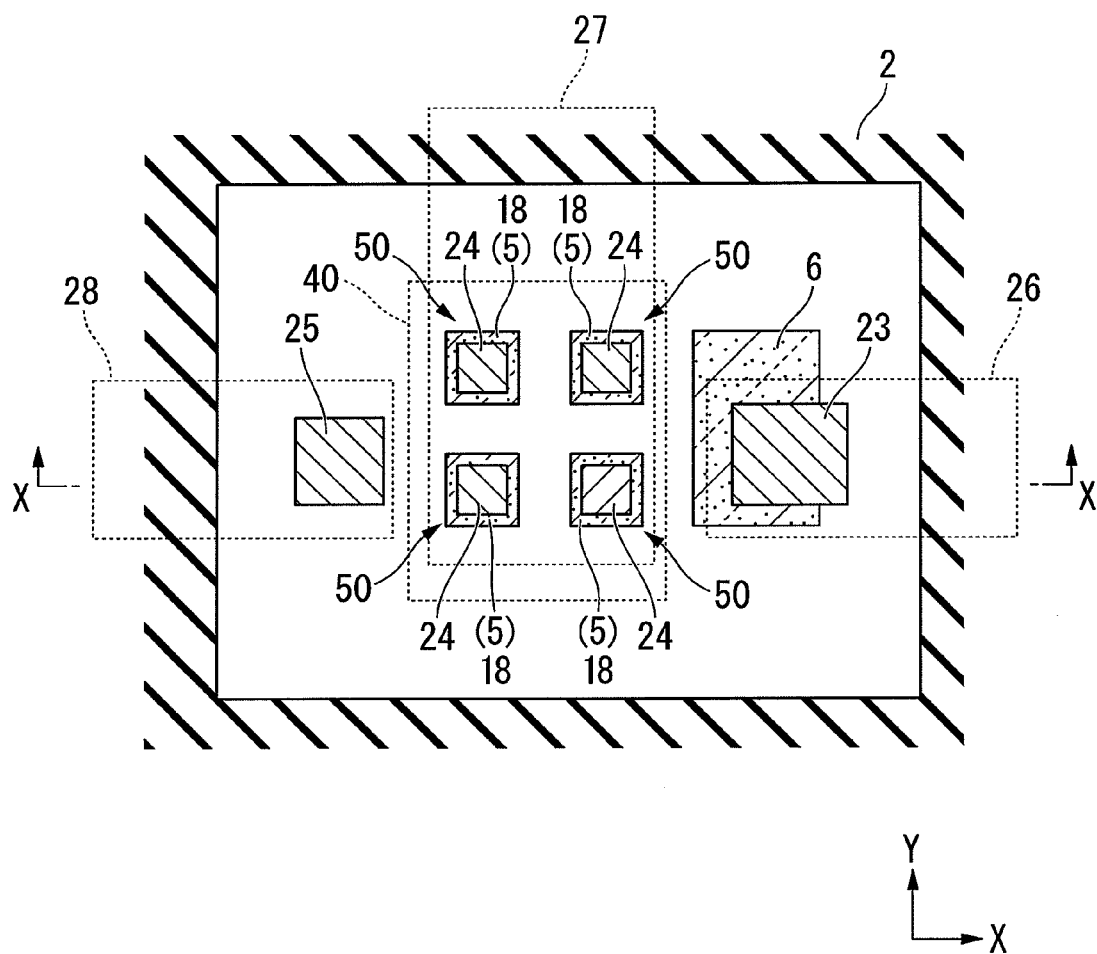
FIG. 2 is a plan view of the semiconductor device shown in FIG. 1.

FIG. 2 is a plan view showing the structure of the semiconductor device shown in FIG. 1. The silicon pillars 5 having a rectangular cross section in the XY plane are provided around the center of an area surrounded by the STI 2. The silicon pillars 5 are arranged in a matrix along the X direction and the Y direction. Each silicon pillar 5 forms the channel and parts of the source section and the drain section of each unit transistor 50. The unit transistors 50 are arranged in a matrix in each area surrounded by the STI 2. A single transistor is formed by the unit transistors 50 arranged in each area surrounded by the STI 2.

The interval between silicon pillars which are adjacent in the X direction, the interval between silicon pillars which are adjacent in the Y direction, and the interval between silicon pillars which are adjacent in a diagonal direction (i.e., a direction which forms an angle of 45 degrees with the X direction) are double or less the film thickness of each gate electrode. The silicon plugs 18, the metal contact plugs 24, and the metal wire 27 are formed over the silicon pillars 5. The silicon pillars 5, the silicon plugs 18, and the metal contact plugs 24 are arranged within the same planar area so that they overlap with each other. The metal wire 27 overlaps the metal contact plugs 24, connects the metal contact plugs 24 to each other, and functions as a common source wire of the unit transistors 50. As a result, the source sections of the unit transistors 50 (i.e., the upper diffused layers 15 and the silicon plugs 18) are electrically connected to each other.

The gate-lifting silicon pillar 6 having a rectangular cross section in the XY plane is formed on the right of the silicon pillar group consisting of the silicon pillars 5. The metal contact plug 23 having a rectangular cross section in the XY plane is formed above the gate-lifting silicon pillar 6. The metal contact plug 23 is formed around a position where the metal contact plug 23 overlaps the gate-lifting silicon pillar 6. The right portion (i.e., the edge portion opposing the silicon pillars 5) of the metal contact plug 23 protrudes beyond the right edge of the gate-lifting silicon pillar 6. At this protruded portion, the metal contact plug 23 is connected to the gate electrode formed over the side face of the gate-lifting silicon pillar 6. The metal wire 26 is formed directly on the metal contact plug 23. The metal wire 26 is connected to the gate electrodes through the metal contact plug 23, and functions as a common gate wire of the unit transistors 50.

The metal contact plug 25 having a rectangular cross section in the XY plane is formed on the left (i.e., the side opposing the gate-lifting silicon pillar 6) of the silicon pillar group. The metal wire 28 is formed directly on the metal contact plug 25. The metal wire 28 is connected to the lower diffused layers through the metal contact plug 25, and functions as a common drain wire of the unit transistors 50.

It is noted that FIG. 2 shows an example in which four silicon pillars 5, each having a rectangular cross section in the XY plane, are arranged in a matrix with two rows in the X direction and two columns in the Y direction. However, the shape, the number, and the arrangement of the silicon pillars 5 are not limited to those of this example. For instance, the shape of the cross section of the silicon pillars 5 in the XY plane may be a circle, or a polygon other than a rectangle. Moreover, when forming a large number of silicon pillars 5, these silicon pillars 5 may be arranged in a honeycomb-shape to form a closed packing structure, thereby making it possible to realize miniaturized and highly integrated semiconductor devices. Furthermore, the size and the shape of the gate-lifting silicon pillar 6 are not limited to a particular size and a particular shape, as long as the gate-lifting silicon pillar 6 functions as a protruding layer which increases the height of the gate electrodes to shorten the distance between the gate electrodes and the metal wire 26 provided thereabove.

Method for Manufacturing Semiconductor Device

FIGS. 3 to 18 are explanatory diagrams showing a first embodiment of a manufacturing method of the semiconductor device in accordance with the first embodiment of the present invention. Specifically, FIGS. 3 to 18 are process diagrams showing the cross-sectional structures taken along the line X-X shown in FIG. 2.

Figure 3:
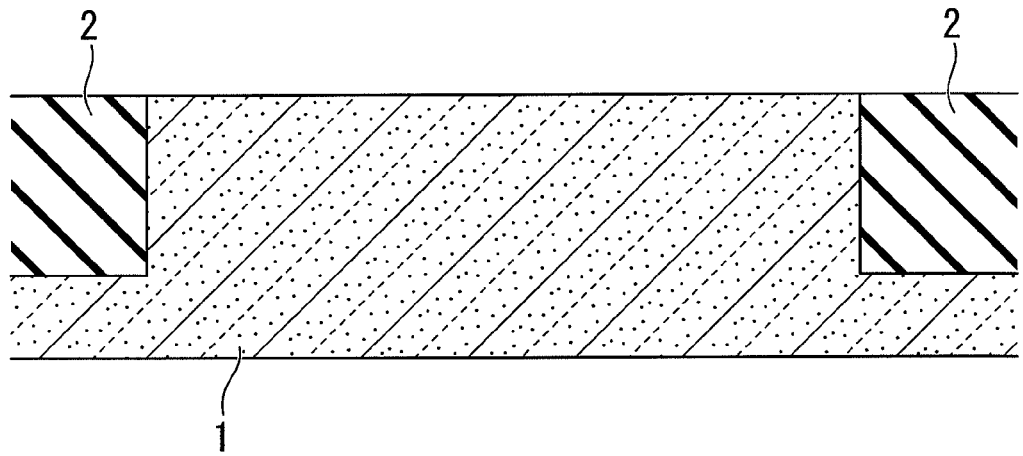
FIGS. 3 to 18 are process diagrams in accordance with a first embodiment of a method for manufacturing the semiconductor device shown in FIG. 1.

First, as shown in FIG. 3, an STI 2, which functions as a device separation, is formed in a silicon substrate 1.

Figure 4:
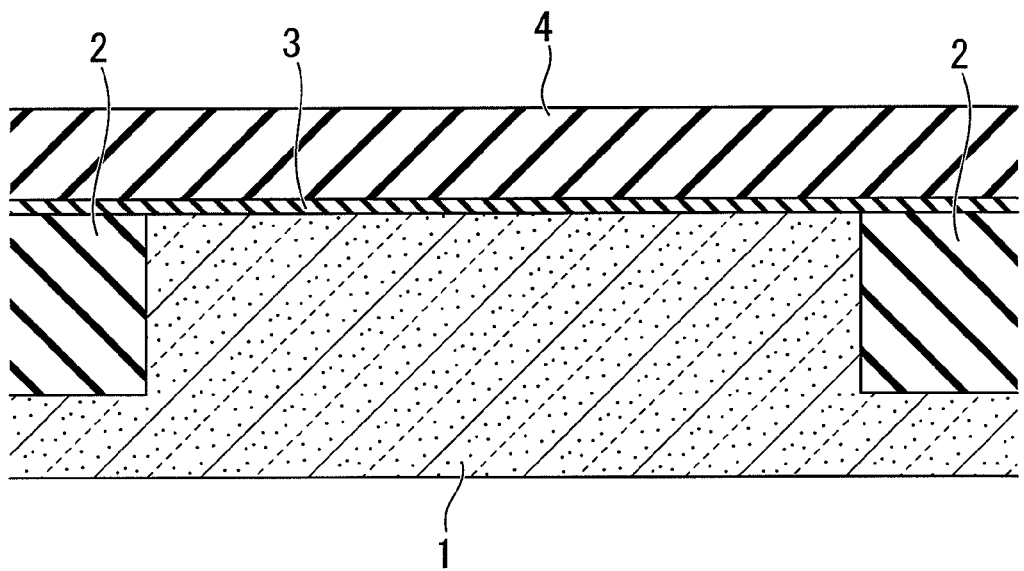

Next, as shown in FIG. 4, an oxide film 3 of 10 nm in thickness is formed on the silicon substrate 1 and the STI 2. A mask nitride film 4 of 120 nm in thickness is then formed on the oxide film 3.

Figure 5:
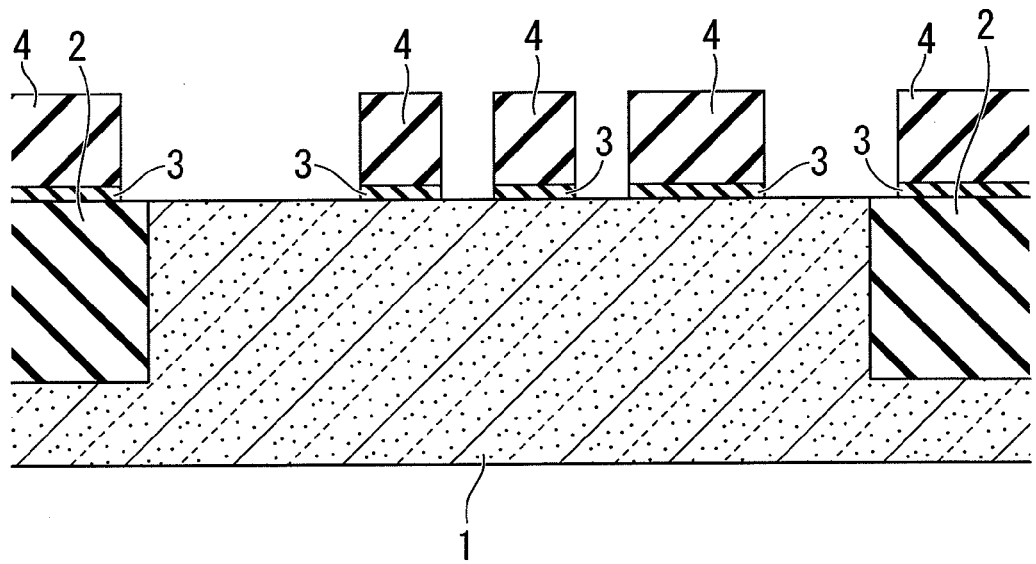

Next, as shown in FIG. 5, the oxide film 3 and the mask nitride film 4 are patterned using a well-known photolithography process and a well-known dry etching process.

Figure 6:
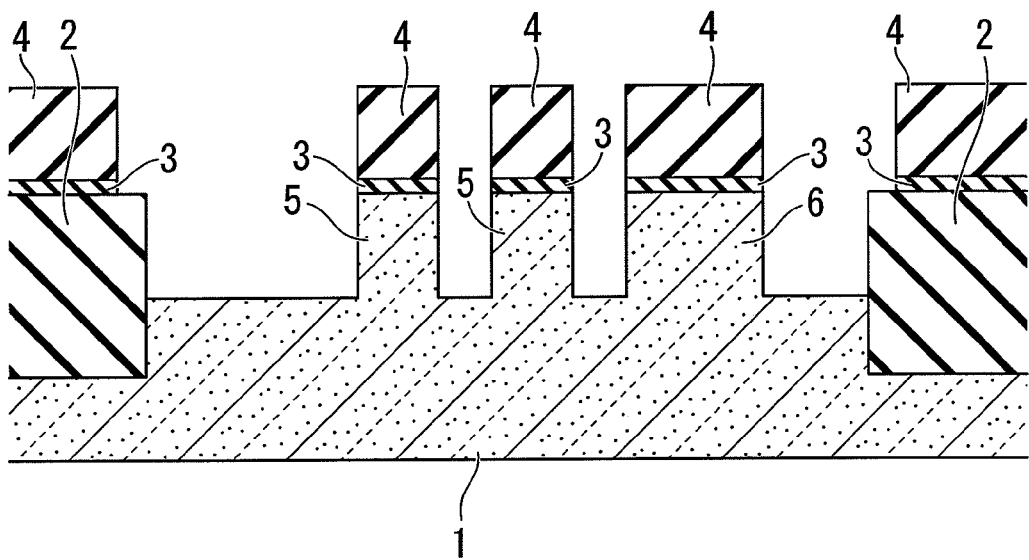

Next, as shown in FIG. 6, the silicon substrate 1 is etched by a depth of approximately 150 nm using the mask nitride films 4 as a mask to form silicon pillars 5, which function as channels and parts of source sections and drain sections of unit transistors, and a gate-lifting silicon pillar 6 for connecting gate electrodes to a metal wire which will be formed above the gate electrodes.

The layout of the silicon pillars 5 and the gate-lifting silicon pillar 6 at this time is that as shown in FIG. 2. Specifically, four silicon pillars 5 used for forming the unit transistors are arranged in an area surrounded by the STI 2, and the interval between the silicon pillars 5 is made double or less the film thickness of each gate electrode which will be formed later. In addition, the interval between the gate-lifting silicon pillar 6 and silicon pillars 5 closest to the gate-lifting silicon pillar 6 is made double or less the film thickness of each gate electrode. The width (i.e., the size of the cross-section in a plane parallel to the silicon substrate 1) of the silicon pillars 5 is a value which allows full depletion of the channels. The gate-lifting silicon pillar 6 for lifting the gate electrodes can be any size. Thus, the size of the gate-lifting silicon pillar 6 may be different from that of the silicon pillars 5.

Figure 7:
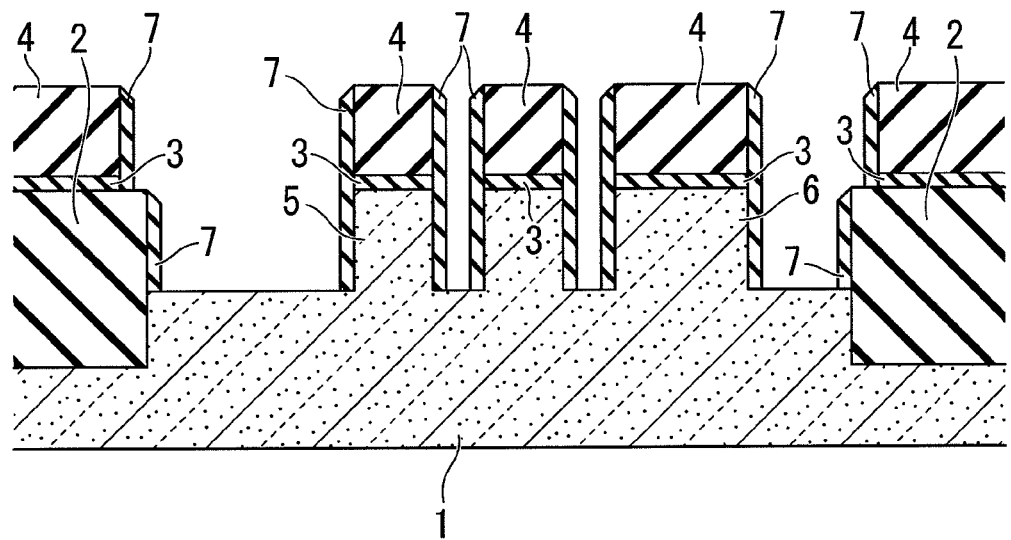

Next, as shown in FIG. 7, the side faces of the silicon pillars 5 and the gate-lifting silicon pillar 6 are oxidized by approximately 5 nm (not shown in the figure), a nitride film of 20 nm in thickness is deposited, and the entire surface is etched back to form sidewall nitride films 7 on the side faces of the silicon pillars 5, the gate-lifting silicon pillar 6, the oxide films 3, and the mask nitride films 4. At this time, a sidewall nitride film 7 is also formed on a part of the side face of the STI 2.

Figure 8:
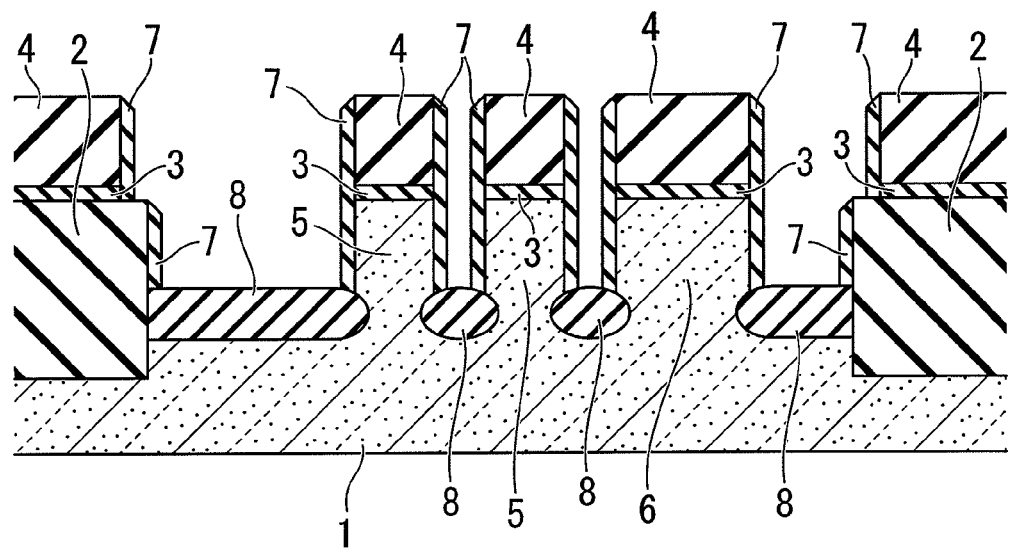

Next, as shown in FIG. 8, silicon oxidation is performed to form an oxide film 8 of 30 nm in thickness at an area where silicon is exposed. At this time, the side faces and the top faces of the silicon pillars 5 and the gate-lifting silicon pillar 6 are not oxidized because nitride films (i.e., the mask nitride films 4 and the sidewall nitride films 7) are formed thereon.

Figure 9:
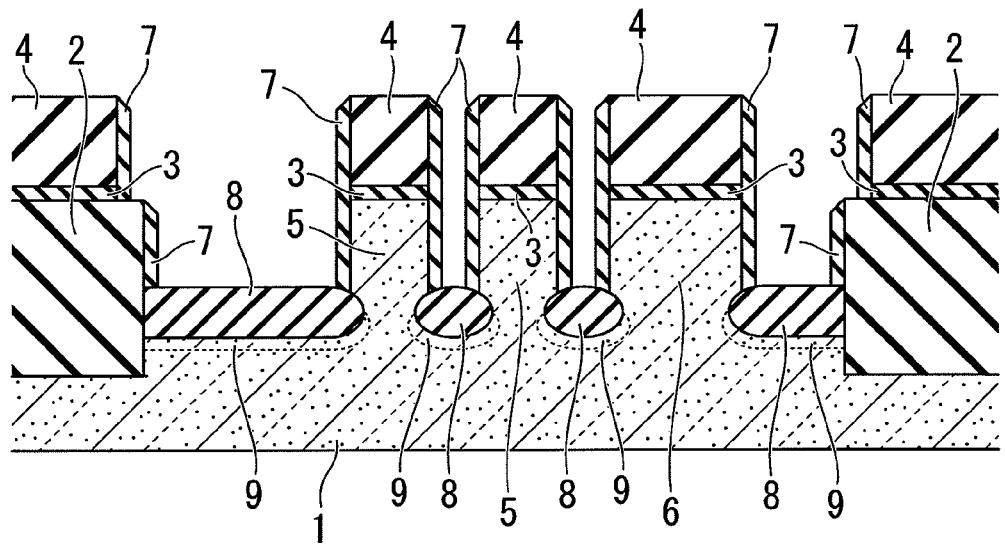

Next, as shown in FIG. 9, impurity (e.g., arsenic in the case of forming an N-channel transistor) ions are injected to form a lower diffused layer 9 at the lower end portions of the silicon pillars 5 and the gate-lifting silicon pillar 6 as well as under the oxide film 8. At this time, the mask nitride films 4 are formed over the top faces of the silicon pillars 5 and the gate-lifting silicon pillar 6. Moreover, the thickness of the mask nitride films 4 is approximately 100 nm, which is sufficiently thick compared to the thickness of 30 nm of the oxide film 8 provided around the lower portions of the silicon pillars 5. Therefore, impurity diffused layers are not formed in the upper portions of the silicon pillars 5 and the gate-lifting silicon pillar 6.

Figure 10:
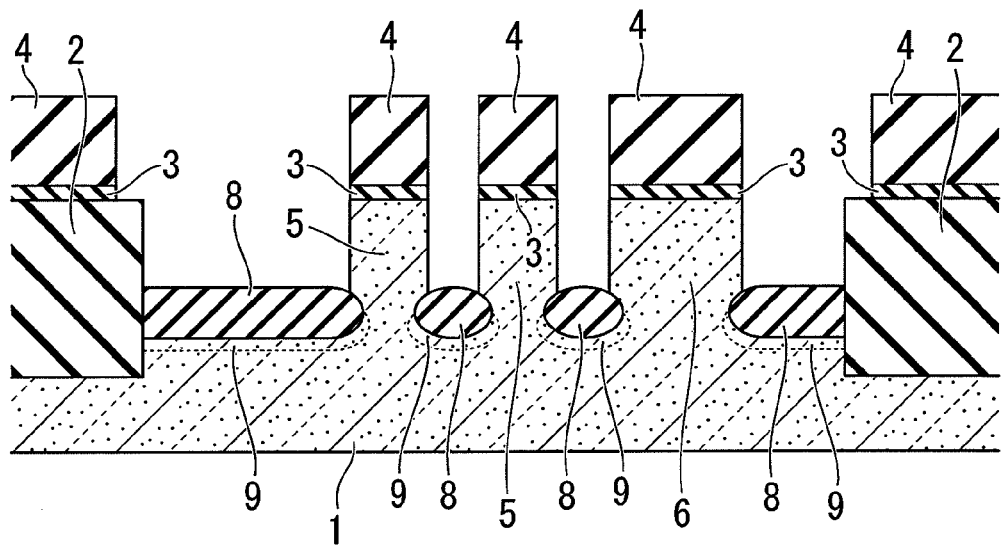

Next, as shown in FIG. 10, oxide films formed on the side faces of the silicon pillars 5 and the gate-lifting silicon pillar 6 as well as the sidewall nitride films 7 are removed.

Figure 11:
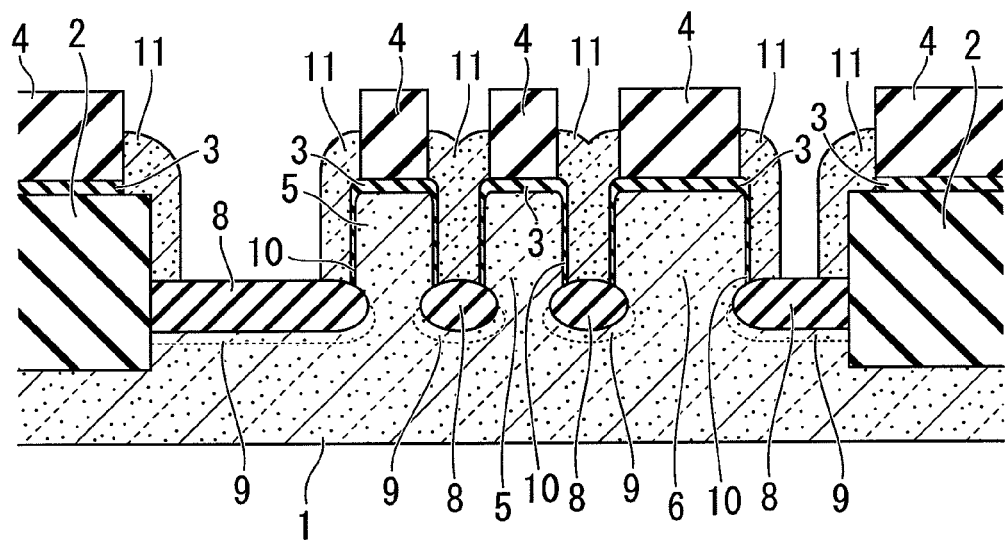

Next, as shown in FIG. 11, gate insulating films 10 are formed on the side faces of the silicon pillars 5 and the gate-lifting silicon pillar 6. When silicon oxide films are used as the gate insulating films 10, the thickness thereof is approximately 3 nm. Next, polysilicon of 20 nm in thickness is deposited over the entire surface, and the entire surface is etched back to form the gate electrodes 11 over the side faces of the silicon pillars 5 and the gate-lifting silicon pillar 6. At this time, gate electrodes 11 are also formed on a part of the side face of the STI 2. Since the interval between the adjacent silicon pillars 5 is double or less the film thickness of each gate electrode 11, the gaps between the adjacent silicon pillars 5 are completely buried by the gate electrodes 11. Similarly, since the interval between the gate-lifting silicon pillar 6 and the silicon pillars 5 closest to the gate-lifting silicon pillar 6 is double or less the film thickness of each gate electrode 11, the gaps between these silicon pillars 5 and the gate-lifting silicon pillar 6 are completely buried by the gate electrodes 11.

Figure 12:
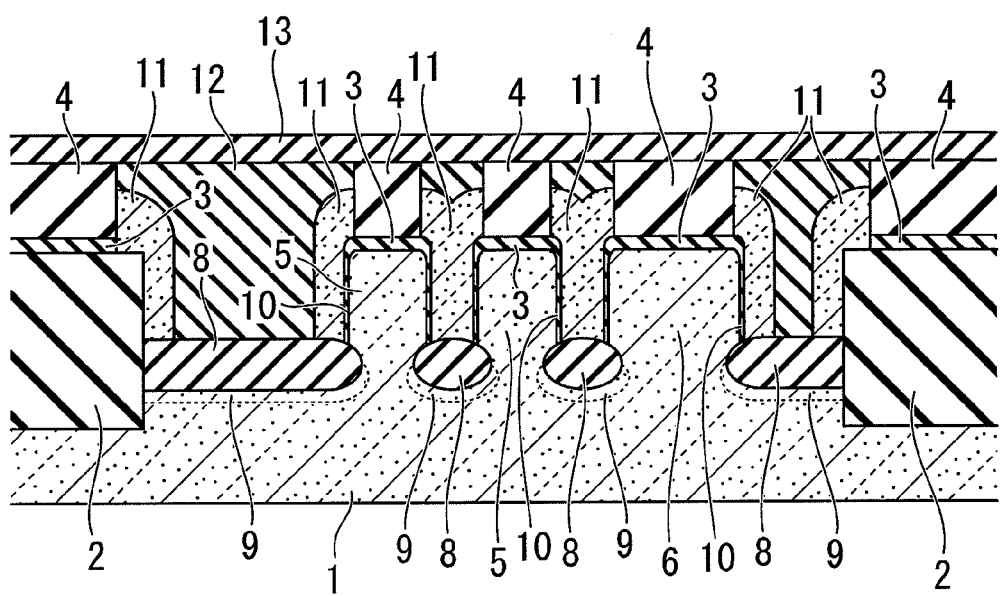

Next, as shown in FIG. 12, a first interlayer insulating film 12 is formed. The first interlayer insulating films 12 is then flattened using a well-known chemical mechanical polishing (CMP) technique so as to expose the mask nitride films 4. Subsequently, a mask oxide film 13 of approximately 30 nm in thickness is deposited.

Figure 13:
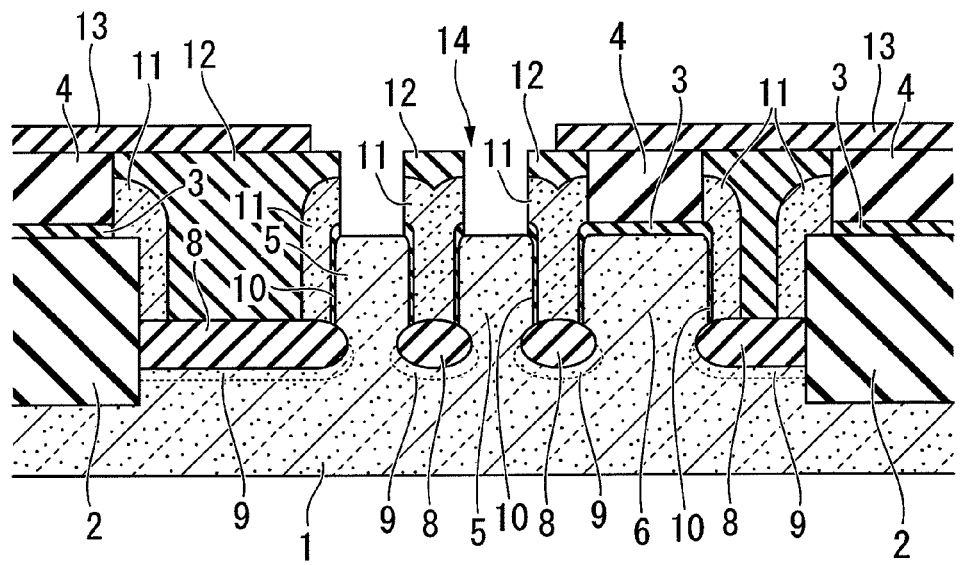

Next, as shown in FIG. 13, a part of the mask oxide film 13 is removed using a well-known photolithography technique and a well-known etching technique. As shown in FIG. 2, a pattern layout 40 used for removing the part of the mask oxide film 13 has a pattern only around an area where the silicon pillars 5 are arranged. Since the mask nitride films 4 are exposed in an area 14 where the mask oxide film 13 has been removed, the mask nitride films 4 provided in the exposed area and the oxide films 3 provided thereunder are selectively removed to form openings over the top faces of the silicon pillars 5.

Figure 14:
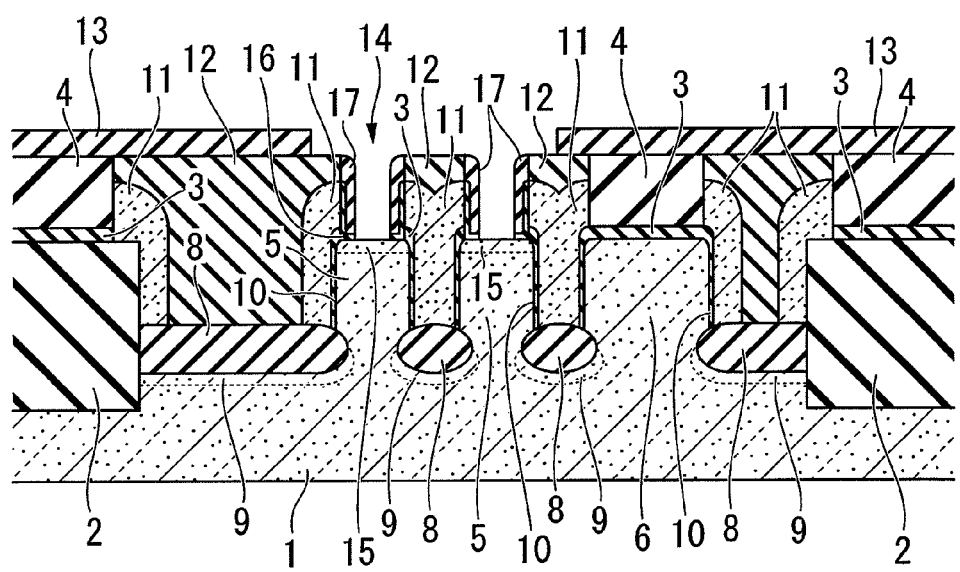

Next, as shown in FIG. 14, after performing an oxidation process to form oxide films 16, impurities (e.g., phosphorus or arsenic in the case of forming an N-channel transistor) are injected into the upper end portions of the silicon pillars 5 through the openings formed over the top faces of the silicon pillars 5 to form upper diffused layers 15. In addition, a nitride film of approximately 10 nm in thickness is deposited, and an etch-back process is performed to form sidewall nitride films 17 in the openings provided over the silicon pillars 5. In forming the sidewall nitride films 17, the oxide films 16 formed on the top faces of the silicon pillars 5 are removed to expose the top faces of the silicon pillars 5. Thus, only the oxide films 16 provided under the sidewall nitride films 17 remain. When the gate electrodes 11 are made of polysilicon, the oxide films 16 provided on the side faces of the exposed polysilicon also remain. The sidewall nitride films 17 form a lightly doped drain (LDD) structure of the transistor, and insulate the gate electrodes 11 from silicon plugs which will be formed later.

Figure 15:
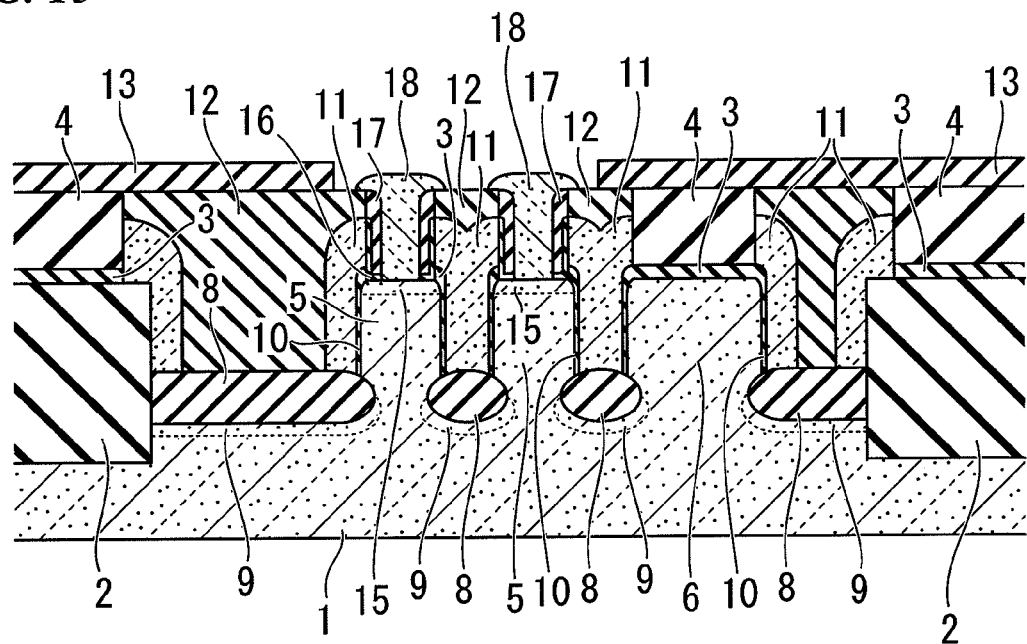

Next, as shown in FIG. 15, silicon plugs 18 are selectively formed on the top faces of the silicon pillars 5 using a selective epitaxial growth method. Subsequently, when an N-channel transistor is to be formed, ions such as arsenic ions are injected to make the silicon plugs 18 an n-type conductor, thereby forming the silicon plugs 18 electrically contacting the upper diffused layers 15.

Figure 16:
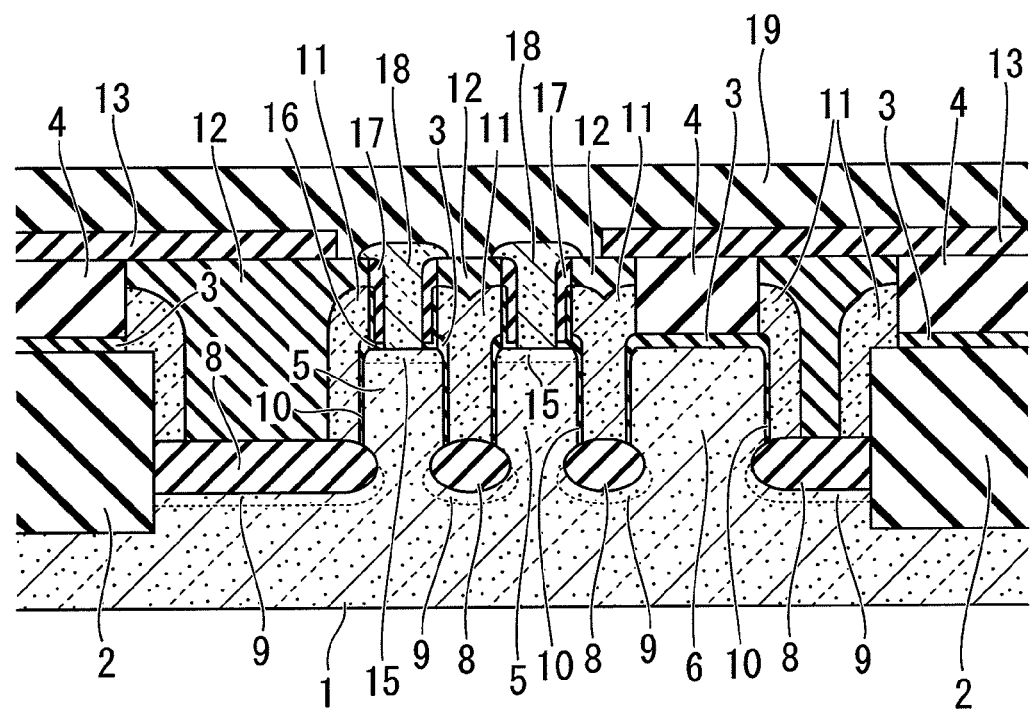

Next, as shown in FIG. 16, a second interlayer insulating film 19 is formed.

Figure 17:
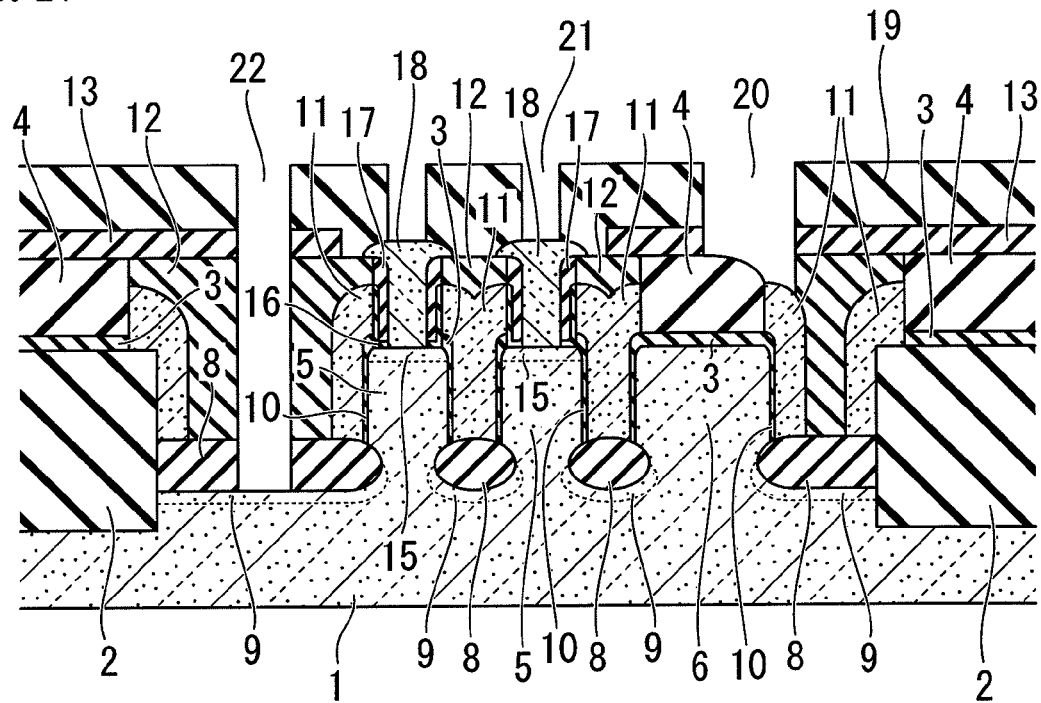

Next, as shown in FIG. 17, a contact hole 20 is formed above the gate-lifting silicon pillar 6 using a well-known photolithography process and a well-known dry etching process. As shown in FIG. 2, the contact hole 20 is arranged at a position which is slightly shifted from the center of the gate-lifting silicon pillar 6. At this time, the mask nitride film 4 remains over the top face of the gate-lifting silicon pillar 6. Therefore, although the second interlayer insulating film 19, the mask oxide film 13, and the first interlayer insulating film 12 are etched, the oxide film 3 and the gate-lifting silicon pillar 6 are not etched. Subsequently, contact holes 21 are formed over the silicon pillars 5, and a contact hole 22 is formed over the lower diffused layer 9. These contact holes 20, 21, and 22 are formed by the same photolithography process. Alternatively, these contact holes may be formed by separate photolithography processes.

Figure 18:
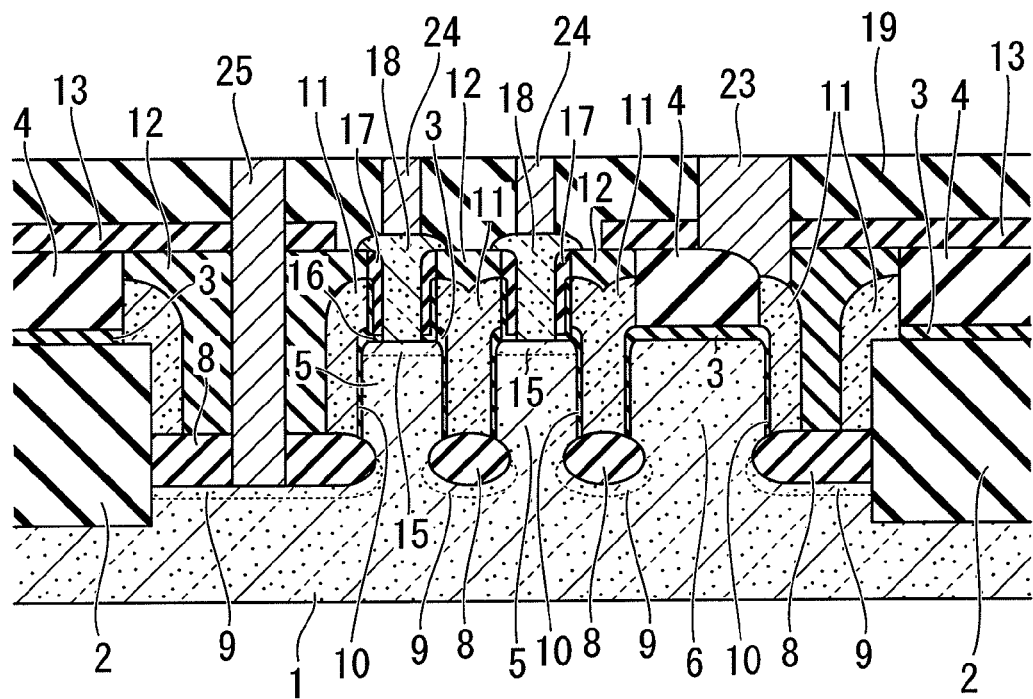

Next, as shown in FIG. 18, the contact holes 20, 21, and 22 are filled with a metal made from W/TiN/Ti to form a metal contact plug 23 for the gate-lifting silicon pillar 6, metal contact plugs 24 for the silicon pillars 5, and a metal contact plug 25 for the lower diffused layer 9.

Next, as shown in FIG. 1, metal wires 26, 27, and 28 made from W/WN are formed. At this time, as shown in the plan view of FIG. 2, the metal contact plugs 24 provided for the silicon pillars 5 are connected to the same metal wire 27.

In this manner, a transistor formed by connecting unit transistors together in parallel is finished.

In accordance with the semiconductor device of the present embodiment described above, the following advantages are obtained.

(1) Since the channel of a single transistor is formed by the silicon pillars 5, the width of each silicon pillar 5 (i.e., the size of a cross-section in a plane parallel to the silicon substrate 1) can be reduced to a value which allows full depletion of the channel. As a result, it is possible to obtain a satisfactory S value and a large drain current while maintaining the characteristics of fully depleted transistors.

(2) Since the interval between adjacent silicon pillars 5 (i.e., the size of the gaps between these silicon pillars 5) is made double or less the thickness of each gate electrode 11, the gate electrodes 11 formed on the side faces of these silicon pillars 5 contact each other, and the gate electrodes 11 are formed over the entire side faces of these silicon pillars 5. Therefore, even when gate electrodes 11 formed in unnecessary areas are removed by an etch-back process, the disconnection of the gate electrodes 11 does not arise in the gaps between the silicon pillars 5, and these gate electrodes 11 function as a single contiguous gate electrode. Moreover, reducing the interval between the silicon pillars 5 contributes to the miniaturization of the semiconductor device.

(3) The oxide film 8, on which the gate electrodes 11 are arranged, is formed on a surface of the silicon substrate 1 which is exposed in the gaps between the adjacent silicon pillars 5. The lower diffused layer 9 is formed under the oxide film 8. As a result, the gate electrodes 11 are insulated from the lower diffused layer 9 by means of the oxide film 8. Therefore, it is possible to certainly prevent the electrical short-circuiting between the gate electrodes 11 and the lower diffused layer 9 from occurring.

(4) The metal wire 26 is provided above the gate electrodes 11 with the first interlayer insulating film 12, the mask oxide film 13, and the second interlayer insulating film 19 interposed therebetween. The gate electrodes 11 are connected to the metal wire 26 through the metal contact plug 23, which is formed in the first interlayer insulating film 12, the mask oxide film 13, and the second interlayer insulating film 19. The gate-lifting silicon pillar 6 is provided near the silicon pillars 5, a part of the surface of the gate-lifting silicon pillar 6 is covered by one of the gate electrodes 11, and the metal contact plug 23 is formed so as to overlap a portion of the gate electrode 11 which covers the surface of the gate-lifting silicon pillar 6. Therefore, the interval between the gate electrode 11 and the metal wire 26 can be reduced by the height of the gate-lifting silicon pillar 6. Thus, the height of the metal contact plug 23, which connects the gate electrode 11 and the metal wire 26, can further be reduced by the height of the gate-lifting silicon pillar 6. As a result, the aspect ratio of the metal contact plug 23 can be reduced, so that it is possible to easily deal with the refinement of the semiconductor device.

(5) The interval between the gate-lifting silicon pillar 6 and the silicon pillars 5 which are closest to the gate-lifting silicon pillar 6 (i.e., the size of the gaps between the gate-lifting silicon pillar 6 and these silicon pillars 5) is made double or less the thickness of each gate electrode 11. Therefore, the gate electrodes 11 formed over the side faces of the silicon pillars 5 contact the gate electrode 11 formed over the side face of the gate-lifting silicon pillar 6, and thus these gate electrodes 11 function as a single contiguous gate electrode. Moreover, reducing the interval between the gate-lifting silicon pillar 6 and the silicon pillars 5 contributes to the miniaturization of the semiconductor device.

(6) The mask nitride film 4 is provided over the gate-lifting silicon pillar 6, a part of the surface of the mask nitride film 4 is covered by one of the gate electrodes 11, and the metal contact plug 23 is formed so as to overlap a portion of the gate electrode 11 which covers the surface of the mask nitride film 4. Therefore, the interval between the gate electrode 11 and the metal wire 26 can further be reduced by the height of the mask nitride film 4, and thus the height of the metal contact plug 23, which connects the gate electrode 11 and the metal wire 26, can also be reduced by the height of the mask nitride film 4. As a result, the aspect ratio of the metal contact plug 23 can be reduced, and thus it is possible to easily deal with the refinement of the semiconductor device.

(7) The silicon pillars 5 and the gate-lifting silicon pillar 6 are formed by etching a surface of the silicon substrate 1. As a result, it is possible to form the silicon pillars 5 and the gate-lifting silicon pillar 6 at the same time. Moreover, in order to increase the height of the silicon pillars 5, it is necessary to increase the height of the gate-lifting silicon pillar 6. However, by etching the silicon substrate 1 to form the silicon pillars 5 and the gate-lifting silicon pillar 6 at the same time, the height of the gate-lifting silicon pillar 6 is comparable to the height of the silicon pillars 5. Therefore, it is possible to easily form a gate-lifting silicon pillar 6 having a large height.

(8) The openings are respectively formed over the top surfaces of the silicon pillars 5. The silicon plugs 18, which are electrically connected to the upper diffused layers 15 of the silicon pillars 5, are formed in the openings. The oxide films 16 and the sidewall nitride films 17 are formed on the inner walls of the openings. Thus, the gate electrodes 11 are electrically insulated from the silicon plugs 18 by the oxide films 16 and the sidewall nitride films 17. Therefore, it is possible to connect the metal wire 27 to the silicon pillars 5 by means of the silicon plugs 18 and the metal contact plugs 24 provided over the silicon pillars 5. As a result, the layout of the wire can be simplified, thereby contributing to the miniaturization of the semiconductor device.

(9) The silicon pillars 5 are arranged in a matrix. Therefore, it is possible to closely arrange the silicon pillars 5, thereby contributing to the miniaturization of the semiconductor device.

Although examples of preferred embodiments of the present invention have been explained with reference to the attached drawings, the present invention is not limited to these examples. The shapes of the respective structural elements and the combinations of the structural elements described in the foregoing embodiments are merely examples, and various modifications can be made based on design requirements, so long as they do not depart from the gist of the present invention. For instance, although the foregoing embodiments employ the silicon substrate as an example of a semiconductor substrate, semiconductor pillars may be formed on a substrate other than a silicon substrate. Moreover, semiconductor pillars and a protruding layer may be formed by forming a semiconductor layer on an insulating substrate such as a glass substrate and subsequently etching the semiconductor layer. Furthermore, the layouts of the metal contact plugs, the silicon plugs, and the wires are merely examples, and any modifications are possible in accordance with design requirements.

Semiconductor Storage Apparatus and Data Processing System

Next, embodiments of a semiconductor storage apparatus and a data processing system which include the semiconductor device in accordance with the present invention will be explained. It is noted that semiconductor storage apparatuses and data processing systems are examples of apparatuses and systems which are provided with the semiconductor device of the present invention. The semiconductor device of the present invention is widely applicable to apparatuses other than semiconductor storage apparatuses and systems other than data processing systems. Although embodiments of the data processing system include a computer system as an example, they are not limited to such a system.

Figure 19:
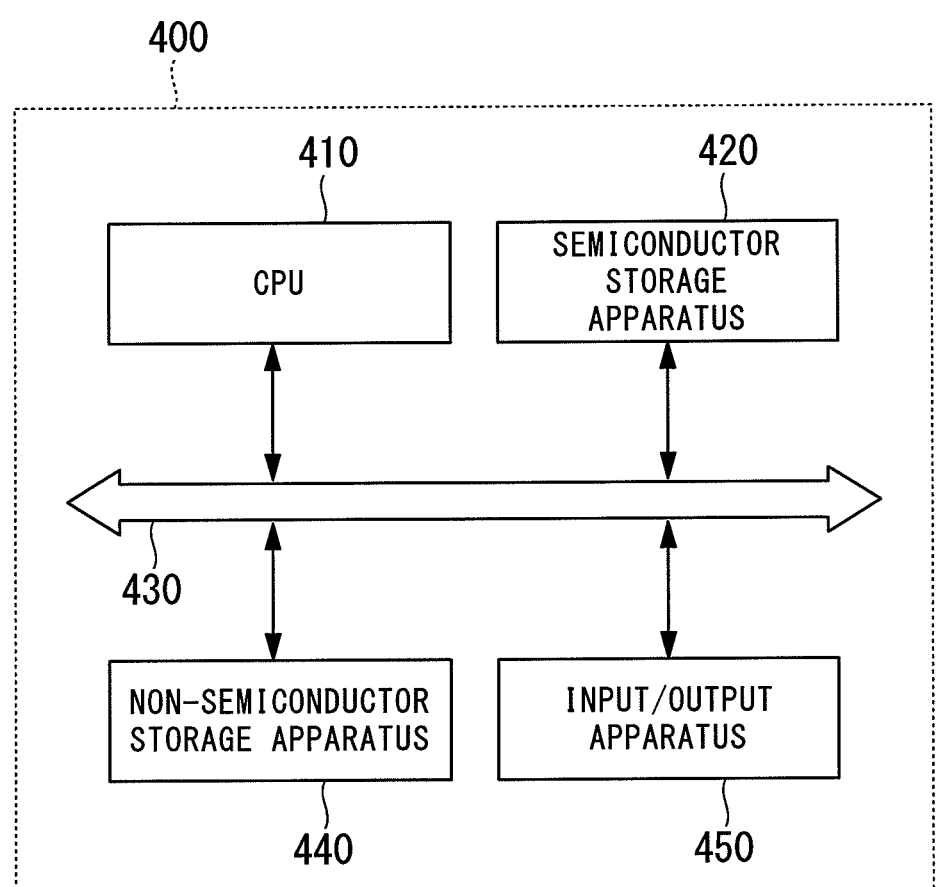
FIG. 19 is a schematic view showing the structure of a first embodiment of a data processing system.

FIG. 19 is a schematic diagram showing the structure of a first embodiment of a data processing system 400. The data processing system 400 is provided with a central processing unit (CPU) 410 and a semiconductor storage apparatus 420. In FIG. 19, the CPU 410 is connected to the semiconductor storage apparatus 420 through a system bus 430; however, they may be connected to each other through a local bus instead of the system bus 430. Moreover, although the system bus 430 is depicted as a single bus in order to simplify the drawing, it may be configured by connecting a plurality of buses serially or in parallel through connectors or the like according to the circumstances. Furthermore, in the data processing system 400, a non-semiconductor storage apparatus 440 and an input/output apparatus 450 are optionally connected to the system bus 430.

The input/output apparatus 450 includes an input apparatus such as a keyboard and a mouse, and an output apparatus includes a display device such as a liquid crystal display. The non-semiconductor storage apparatus 440 includes a device such as a hard disk drive and a magneto-optical (MO) drive. However, the input/output apparatus 450 and the non-semiconductor storage apparatus 440 are not limited to these devices. The input/output apparatus 450 may include only an input apparatus or only an output apparatus. The semiconductor storage apparatus 420 is, for example, a random access memory (RAM) or a read only memory (ROM). More specifically, the semiconductor storage apparatus 420 is a storage medium formed from semiconductor devices such as: a static random access memory (SRAM); a DRAM such as a synchronous dynamic random access memory (SDRAM), a double data rate synchronous dynamic random access memory (DDR-SDRAM), a double data rate 2 synchronous dynamic random access memory (DDR2-SDRAM), or a double data rate 3 synchronous dynamic random access memory (DDR3-SDRAM); or a flash memory.

In this way, an example of the application of the present invention is a semiconductor storage apparatus which is provided with various types of memories. Exemplary applications are the foregoing DRAMs, but it is apparent that the present invention can be widely applied to semiconductor storage apparatuses which are provided with various types of memories in addition to memories such as a RAM and a ROM.

It is noted that FIG. 19 shows an example in which the number of the respective structural elements is one in order to simplify the drawing. However, the present embodiment is not limited to such a structure and the number of all or some of the structural elements may be plural.

Figure 20:
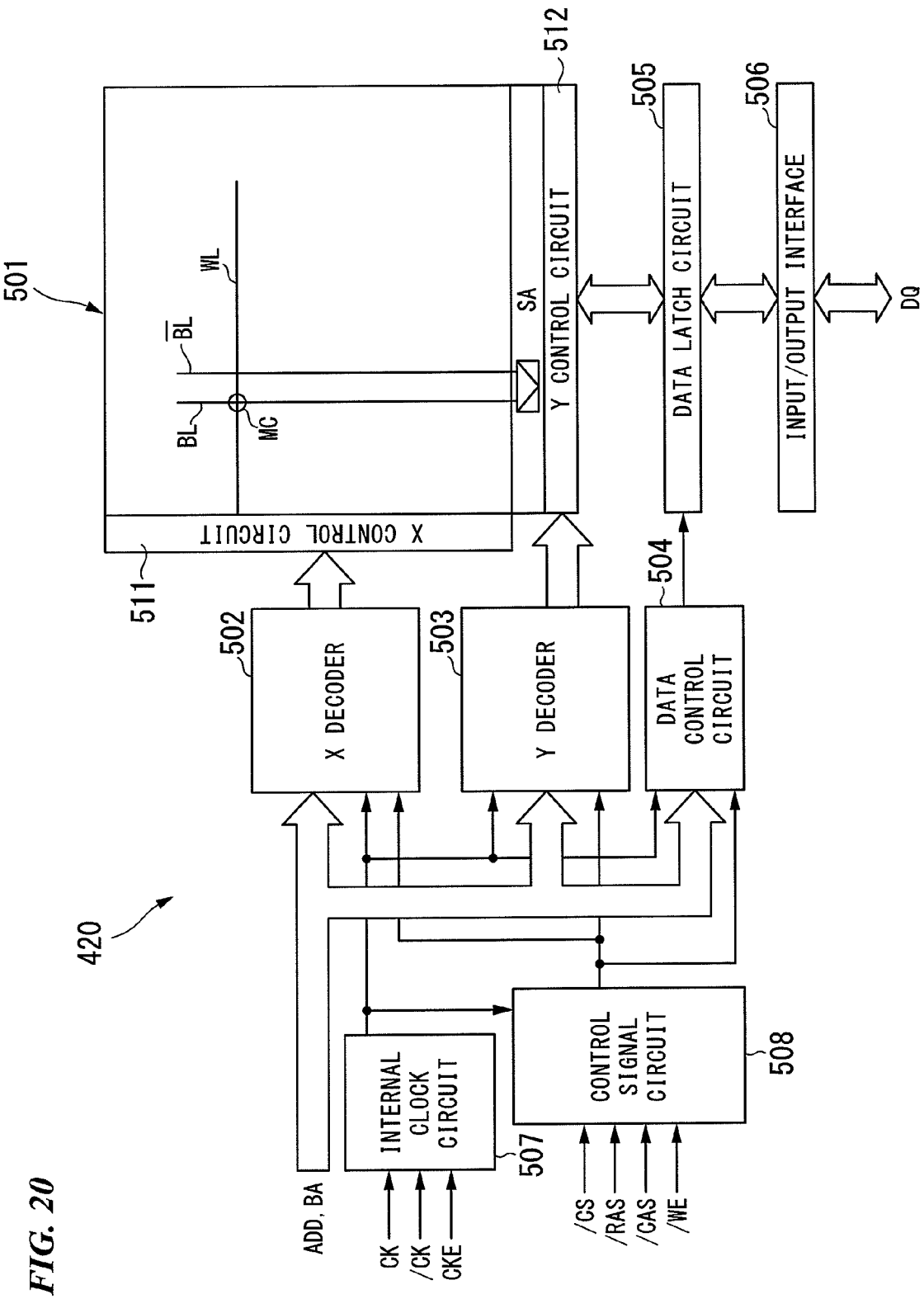
FIG. 20 is a schematic view showing the structure of a first embodiment of a semiconductor storage apparatus provided in the data processing system shown in FIG. 19.

FIG. 20 is a schematic diagram showing the structure of a first embodiment of the semiconductor storage apparatus 420. The semiconductor storage apparatus 420 is provided with a memory array 501, an X decoder 502, a Y decoder 503, a data control circuit 504, a data latch circuit 505, an input/output interface 506, an internal clock circuit 507, and a control signal circuit 508.

The memory array 501 is provided with word lines WL, bit line pairs BL and /BL, a sense amplifying circuit SA (sense amplifiers), and memory cells MC provided at intersections between the respective word lines WL and the respective bit lines BL.

The memory array 501, the data latch circuit 505, and the input/output interface 506 are connected through data transfer buses. The data control circuit 504 controls data transfer by the data latch circuit 505. The X decoder 502 and the Y decoder 503 control operations such as writing into a memory cell MC provided in the memory array 501 and reading from the memory cell MC. A clock CK, a clock /CK, and a clock enable CKE are input to the internal clock circuit 507, which generates an internal clock used by the control signal circuit 508, the X decoder 502, the Y decoder 503, and the data control circuit 504. The control signal circuit 508 generates control signals for controlling the X decoder 502, the Y decoder 503, and the data control circuit 504 based on a chip select /CS, a row address strobe /RAS, a column address strobe /CAS, and a write enable /WE which are input thereto, and outputs the control signals. It is noted that the symbol "/" means that an active level of a signal to which this symbol is prefixed is a low level.

The memory cells (storage elements) MC for storing data are provided at the respective intersections between the word lines WL and the bit lines BL. Each memory cell MC includes a capacitor for storing data and a selection transistor. The gate of the selection transistor is connected to a word line, one of a drain and a source of the selection transistor is connected to a bit line BL, and the other of the drain and the source of the selection transistor is connected to the capacitor.

The sense amplifying circuit SA amplifies a signal which has been read on a bit line from a capacitor for data storage, and detects the stored data. The detection of the data performed in the memory array 501 is realized by detecting a minute potential difference generated between a pair of bit lines which has been amplified by the sense amplifying circuit SA.

Each of the memory cells MC forming the memory array 501 includes the semiconductor device of the present invention. The semiconductor device of the present invention may be provided in the sense amplifying circuit SA, an X control circuit 511, and/or a Y control circuit 512. The semiconductor device of the present invention may also be provided in the X decoder 502, the Y decoder 503, the data control circuit 504, the data latch circuit 505, and/or the input/output interface 506.

Since each semiconductor includes a transistor having a vertical SGT structure, when the semiconductor device of the present invention is applied to, for example, the memory cells MC provided in the memory array 501, it is possible to provide a compact and high density memory array 501. Moreover, since the channel of each transistor is formed by a plurality of fine silicon pillars, each silicon pillar can be fully depleted, and thus it is possible to realize transistors which provide not only quick responses but also low power consumption. Therefore, a quick response and low power consumption memory array 501 can be realized.

In particular, low power consumption is a trend of the times in recent years, and technological development is advancing for reducing power consumption in various types of electronic equipment which are provided with semiconductor devices. For example, compact, low power consumption, and long-battery life electronic equipments are desired in the field of portable electronic equipment such as mobile phones and digital music players. In addition, there are demands for realizing more compact and low power consumption data processing systems built in electronic equipment. Since the present invention can realize compact and low power consumption transistors, it is possible to make electronic equipment which includes a data processing system compact and low power consumption. Moreover, the quickly responsive transistors make it possible to provide data processing systems and electronic equipment having a high throughput speed and high performance.

Such advantages can also be obtained when the semiconductor device of the present invention is applied to the sense amplifying circuit SA, the X control circuit 511, the Y control circuit 512, the X decoder 502, the Y decoder 503, the data control circuit 504, the data latch circuit 505, and/or the input/output interface 506. Furthermore, such advantages can be obtained when the semiconductor device of the present invention is applied to the CPU 410, the non-semiconductor storage apparatus 440, and/or the input/output apparatus 450. Since the size and the drive performance of the data processing system 400 depend on the size and the drive performance of respective transistors, compact and high performance data processing systems can be provided by replacing the existing transistors with the semiconductor devices of the present invention.

It is apparent that the present invention is not limited to the above embodiments, but may be modified and changed without departing from the scope and spirit of the invention.

What is claimed is:

1. A semiconductor device comprising:
   semiconductor pillars which include impurity diffused layers, each semiconductor pillar having a width which allows full depletion of a semiconductor forming each semiconductor pillar, the impurity diffused layers being electrically connected to each other;
   a common gate section which covers side faces of the pillars;
   a first protruding layer comprising a gate-lifting semiconductor pillar formed near a group of the semiconductor pillars;
   a second protruding layer which is formed above a top face of the first protruding layer;
   a gate electrode which is formed along a side face of the first protruding layer and on a side face of the second protruding layer and is connected to other gate electrodes, the gate electrode not being disposed on a top face of the second protruding layer;
   a gate wire which is provided above the gate electrode; and
   a first conductive plug having a lower end which connects both to an upper end of the gate electrode formed along the side face of the first protruding layer and on the side face of the second protruding layer and to the top face of the second protruding layer, and the first conductive plug having an upper end which connects to the gate wire and overlaps a portion of the gate electrode which covers the side face of the first protruding layer, wherein the gate section includes gate electrodes which are formed over the side faces of the pillars and contact each other, and wherein a part of the side face of the second protruding layer is covered by the gate electrode, and the first conductive plug overlaps a portion of the gate electrode which covers the side face of the second protruding layer.

2. The semiconductor device as recited in claim 1, wherein the interval between adjacent semiconductor pillars is double or less the thickness of each gate electrode.

3. The semiconductor device as recited in claim 1, wherein the interval between the first protruding layer and a semiconductor pillar which is closest to the first protruding layer is double or less the thickness of each gate electrode.

4. The semiconductor device as recited in claim 1, wherein the impurity diffused layers include:
 a first impurity diffused layer which is provided at first end portions of the pillars; and second impurity diffused layers which are provided at second end portions of the pillars,
 the semiconductor device further comprises third impurity diffused layers which are connected to the second impurity diffused layers,
 the first impurity diffused layer extends over an area between the pillars, and connects to the first impurity diffused layer of an adjacent silicon pillar to form a common drain section, and
 the second impurity diffused layers and the third impurity diffused layers form source sections.

5. The semiconductor device as recited in claim 4, further comprising a first insulating film which is formed between the gate section and the drain section, and insulates the drain section from the gate section.

6. The semiconductor device as recited in claim 4, further comprising:
 openings which are formed over top surfaces of the pillars and in which the third impurity diffusion layers are formed; and
 second insulating films which are formed on inner walls of the openings, and electrically insulate the third impurity diffusion layers from the gate section.

7. The semiconductor device as recited in claim 4, further comprising:
 second conductive plugs which are connected to the third diffused-layers; and
 a source wire which connects the second conductive plugs to each other.

8. The semiconductor device as recited in claim 4, wherein the semiconductor device is a single transistor which includes unit transistors, and the pillars include channels of the unit transistors.

9. The semiconductor device as recited in claim 8, wherein the channels are intermediate portions of the pillars which are interposed between the first impurity diffused layer and the second impurity diffused layers.

10. The semiconductor device as recited in claim 4, further comprising:
 a third conductive plug which is connected to the drain section; and
 a drain wire which is connected to the third conductive plug.

11. The semiconductor device as recited in claim 1, further comprising gate insulating films which are formed on the side faces of the pillars, wherein the gate section covers the gate insulating films and fills a gap between the pillars.

12. A data processing system comprising a semiconductor device which is provided with:
 semiconductor pillars which include impurity diffused layers, each semiconductor pillar having a width which allows full depletion of a semiconductor forming each semiconductor pillar, the impurity diffused layers being electrically connected to each other;
 a common gate section which covers side faces of the pillars;
 a first protruding layer comprising a gate-lifting semiconductor pillar formed near a group of the semiconductor pillars;
 a second protruding layer which is formed above a top face of the first protruding layer;
 a gate electrode which is formed along a side face of the first protruding layer and on a side face of the second protruding layer and is connected to other gate electrodes, the gate electrode not being disposed on a top face of the second protruding layer;
 a gate wire which is provided above the gate electrode; and
 a first conductive plug having a lower end which connects both to an upper end of the gate electrode formed along the side face of the first protruding layer and on the side face of the second protruding layer and to the top face of the second protruding layer, and the first conductive plug having an upper end which connects to the gate wire and overlaps a portion of the gate electrode which covers the side face of the first protruding layer, wherein the gate section includes gate electrodes which are formed over the side faces of the pillars and contact each other, and wherein a part of the side face of the second protruding layer is covered by the gate electrode, and the first conductive plug overlaps a portion of the gate electrode which covers the side face of the second protruding layer.

13. A semiconductor device comprising:
 a semiconductor area surrounded by a shallow trench isolation (STI) in a semiconductor substrate, the semiconductor area having a recessed upper surface, the recessed upper surface being lower than an upper surface of the STI in the first direction orthogonal to a surface of the semiconductor substrate;
 a silicon pillar group comprising a plurality of silicon pillars disposed in the semiconductor area, each silicon pillar protruding from the recessed upper surface in the first direction;
 a first protruding layer disposed in the semiconductor area and adjacent to the silicon pillar group, the first protruding layer protruding from the recessed upper surface in the first direction, the first protruding layer comprising the semiconductor substrate;
 a second protruding layer disposed above an upper surface of the first protruding layer via a first oxide film, the second protruding layer comprising a dielectric film;
 a second oxide film disposed on the recessed upper surface without the silicon pillars and the first protruding layer;
 a first impurity diffused layer disposed under the second oxide film;
 a second impurity diffused layer disposed on an upper end portion of the each silicon pillars;
 a gate insulating film disposed on a side surface of the silicon pillars and on the first protruding layer;

a gate electrode disposed on the gate insulating film and on a side surface of the second protruding layer without an upper surface of the second protruding layer;

a first interlayer insulating film covering the gate electrode and the second oxide film, the interlayer insulating film disposed only above the semiconductor area;

a second interlayer insulating film disposed above the first interlayer insulating film and the STI;

a gate wire disposed on the second interlayer insulating film; and a first conductive plug penetrating the second interlayer insulating film and a part of the first interlayer insulating film, thereby the gate wire being connected to the gate electrode disposed on the side surface of the second protruding layer, wherein an upper end of the first conductive plug is connected to the gate wire and a lower end of the first conductive plug is both connected to an upper end of the gate electrode disposed on the side surface of the second protruding layer and a part of an upper surface of the second protruding layer.

14. The semiconductor device as recited in claim 13, wherein both of the interval between adjacent silicon pillars and the interval between the first protruding layer and the silicon pillar closest to the first protruding layer.

15. The semiconductor device as recited in claim 13, wherein the first impurity diffused layer is provided at second end portions of the silicon pillars, and the semiconductor device further comprises third impurity diffused layers connected to the second impurity diffused layers, the first impurity diffused layer extends on the recessed upper surface, and connects to the first impurity diffused layer of an adjacent silicon pillar to form a common drain section, and the second impurity diffused layers and the third impurity diffused layers form source section.

16. The semiconductor device as recited in claim 13, further comprising:

openings disposed over upper surfaces of the silicon pillars and in which the third impurity diffused layers are disposed; and a insulating film disposed on inner walls of the openings, and electrically insulate third impurity diffused layers from the gate electrode.

17. The semiconductor device as recited in claim 13, further comprising:

second conductive plugs penetrating the second interlayer insulating film, and connected to the third impurity diffused layers; and a source wire disposed on the second interlayer insulating film, and connecting the second conductive plugs to each other.

18. The semiconductor device as recited in claim 13, wherein the semiconductor device is a single transistor that includes unit transistors, and the silicon pillars include channels of each of the unit transistors.

19. The semiconductor device as recited in claim 13, further comprising:

a third conductive plug penetrating the second interlayer insulating film, the first interlayer insulating film and the second oxide film, and connected to the first impurity diffused layer; and a drain wire disposed on the second interlayer insulating film, and connected to the third conductive plug.

20. The semiconductor device as recited in claim 13, wherein the silicon pillars are arranged in a matrix.

* * * * *